United States Patent
Christiansen et al.

(10) Patent No.: US 10,165,667 B1
(45) Date of Patent: Dec. 25, 2018

(54) COMPUTING SYSTEM WITH SUPERCONDUCTING AND NON-SUPERCONDUCTING COMPONENTS LOCATED ON A COMMON SUBSTRATE

(71) Applicant: Microsoft Technology Licensing, LLC, Redmond, WA (US)

(72) Inventors: Martin B. Christiansen, Ellicott City, MD (US); Stanley K. Wakamiya, Ellicott City, MD (US); Leonard G. Chorosinski, Ellicott City, MD (US); Harlan C. Heffner, Ellicott City, MD (US)

(73) Assignee: Microsoft Technologies Licensing, LLC, Redmond, WA (US)

( * ) Notice: Subject to any disclaimer, the term of this patent is extended or adjusted under 35 U.S.C. 154(b) by 0 days.

(21) Appl. No.: 15/921,311

(22) Filed: Mar. 14, 2018

(51) Int. Cl.
*H05K 7/00* (2006.01)
*H05K 5/00* (2006.01)
*H05K 1/02* (2006.01)
*G06F 1/18* (2006.01)
*H05K 1/18* (2006.01)

(52) U.S. Cl.
CPC ............ *H05K 1/0201* (2013.01); *G06F 1/182* (2013.01); *H05K 1/181* (2013.01); *H05K 2201/062* (2013.01); *H05K 2201/10159* (2013.01)

(58) Field of Classification Search
CPC ...................................................... H05K 5/00
See application file for complete search history.

(56) References Cited

U.S. PATENT DOCUMENTS

| | | | |
|---|---|---|---|
| 5,773,875 | A | 6/1998 | Chan |
| 8,735,225 | B2 | 5/2014 | Palmateer et al. |
| 9,460,397 | B2 | 10/2016 | Apalkov et al. |
| 9,520,180 | B1 | 12/2016 | Mukhanov et al. |

(Continued)

OTHER PUBLICATIONS

Pinkston, et al., "Superconducting Technology Assessment", In Journal of National Security Agency Office of Corporate Assessments, Aug. 2005, 258 Pages.

(Continued)

*Primary Examiner* — Jerry Wu
(74) *Attorney, Agent, or Firm* — Singh Law, PLLC; Ranjeev Singh

(57) ABSTRACT

A computing system including a common substrate having both superconducting components and non-superconducting components is provided. The superconducting components may be attached towards a first end of the common substrate and the non-superconducting components may be attached towards a second end, opposite to the first end, of the common substrate. The common substrate may include circuit traces for interconnecting the superconducting components with the non-superconducting components. A heat-shield may thermally separate the first end from the second end of the common substrate such that the superconducting components are configured to operate in a temperature range between 2 Kelvin to 77 Kelvin and the non-superconducting components are configured to operate in a temperature range between 200 Kelvin to 400 Kelvin. Each of the superconducting components may be configured to provide primarily a processor functionality and each of the non-superconducting components may be configured to provide primarily a storage functionality.

20 Claims, 8 Drawing Sheets

(56) References Cited

U.S. PATENT DOCUMENTS

| | | |
|---|---|---|
| 9,524,470 B1 | 12/2016 | Chow et al. |
| 9,648,749 B1 | 5/2017 | Christiansen et al. |
| 9,681,533 B2 | 6/2017 | Christiansen et al. |
| 2016/0128238 A1* | 5/2016 | Shedd .................. F25B 23/006 361/679.47 |
| 2017/0142856 A1 | 5/2017 | Christiansen et al. |
| 2017/0303392 A1* | 10/2017 | Naigertsik ......... H05K 7/20163 |

OTHER PUBLICATIONS

Shah, Agam, "Microsoft's cool quantum computing plan embraces cryogenic memory", Retrieved from<<https://www.infoworld.com/article/3190714/computers/microsofts-cool-quantum-computing-plan-embraces-cryogenic-memory.html>>, Apr. 18, 2017, 3 Pages.

Ware, et al., "Do superconducting processors really need cryogenic memories?: the case for cold DRAM", In Proceedings of International Symposium on Memory Systems, Oct. 2, 2017, 6 Pages.

* cited by examiner

COMPUTING SYSTEM WITH SUPERCONDUCTING AND NON-SUPERCONDUCTING COMPONENTS LOCATED ON A COMMON SUBSTRATE

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems. As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors.

An additional approach to the use of processors and related components, based on CMOS technology, is the use of superconducting logic-based components and devices. Superconducting logic-based components and devices can also be used to process quantum information, such as qubits. But, even superconducting logic-based devices, such as superconducting memories, consume significant amount of power because of the need to operate at cryogenic temperatures (e.g., 4 K).

SUMMARY

In one aspect of the present disclosure, a computing system including a housing, where a lower pressure is maintained inside the housing than an atmospheric pressure outside the housing is provided. The computing system may further include a first substrate, inside the housing, arranged in a first plane having a first surface and a second surface parallel to the first plane, where the second surface is opposite to the first surface, where a first set of the first plurality of components is attached to the second surface towards a first end of the first substrate and where a second set of the second plurality of components is attached to the second surface towards a second end of the first substrate, where the first end is opposite to the second end, where each of the first plurality of components is configured to provide primarily a processor functionality and where each of the second plurality of components is configured to provide primarily a storage functionality.

The computing system may further include a second substrate, inside the housing, arranged in a second plane above or below the first plane, the second substrate having a third surface and a fourth surface parallel to the second plane, where the fourth surface is opposite to the third surface, where a third set of the first plurality of components is attached to the fourth surface towards a third end of the second substrate and where a fourth set of the second plurality of components is attached to the fourth surface towards a fourth end of the second substrate, where the third end is opposite to the fourth end, and where each of the first substrate and the second substrate comprising a plurality of circuit traces for interconnecting at least a subset of the first plurality of the components with at least a subset of the second plurality of components.

The computing system may further include a heat-shield configured to thermally separate the first end from the second end of the first substrate and thermally separate the third end from the fourth end of the second substrate such that each of the first plurality of components is configured to operate at a first temperature and each of the second plurality of components is configured to operate at a second temperature greater than the first temperature, and where the first temperature is in a range between 2 Kelvin to 77 Kelvin and wherein the second temperature is in a range between 200 Kelvin to 400 Kelvin.

In another aspect of the present disclosure, a computing system comprising housing, where a vacuum is maintained inside the housing is provided. The computing system may further include a first substrate, inside the housing, arranged in a first plane having a first surface and a second surface parallel to the first plane, where the second surface is opposite to the first surface, where a first set of the first plurality of components is attached to the second surface towards a first end of the first substrate and where a second set of the second plurality of components is attached to the second surface towards a second end of the first substrate, where the first end is opposite to the second end, where each of the first plurality of components is configured to provide primarily a processor functionality and where each of the second plurality of components is configured to provide primarily a storage functionality.

The computing system may further include a second substrate, inside the housing, arranged in a second plane above or below the first plane, the second substrate having a third surface and a fourth surface parallel to the second plane, where the fourth surface is opposite to the third surface, where a third set of the first plurality of components is attached to the fourth surface towards a third end of the second substrate and where a fourth set of the second plurality of components is attached to the fourth surface towards a fourth end of the second substrate, where the third end is opposite to the fourth end, and where each of the first substrate and the second substrate comprising a plurality of circuit traces for interconnecting at least a subset of the first plurality of the components with at least a subset of the second plurality of components.

The computing system may further include a heat-shield configured to thermally separate the first end from the second end of the first substrate and thermally separate the third end from the fourth end of the second substrate such that each of the first plurality of components is configured to operate at a first temperature and each of the second plurality of components is configured to operate at a second temperature greater than the first temperature, and where the first temperature is in a range between 2 Kelvin to 77 Kelvin and where the second temperature is in a range between 200 Kelvin to 400 Kelvin.

In yet another aspect, the present disclosure relates to a computing system including a housing, where a vacuum is maintained inside the housing. The computing system may further include a first substrate, inside the housing, arranged in a first plane having a first surface and a second surface parallel to the first plane, where the second surface is opposite to the first surface, where a first set of the first plurality of components is attached to the second surface towards a first end of the first substrate and where a second set of the second plurality of components is attached to the second surface towards a second end of the first substrate, where the first end is opposite to the second end, where each of the first plurality of components is configured to provide primarily a processor functionality and where each of the second plurality of components is configured to provide primarily a storage functionality, and where a first heat sink is coupled to the first substrate to thermally clamp the first substrate.

The computing system may further include a second substrate, inside the housing, arranged in a second plane above or below the first plane, the second substrate having a third surface and a fourth surface parallel to the second plane, where the fourth surface is opposite to the third surface, where a third set of the first plurality of components is attached to the fourth surface towards a third end of the second substrate and where a fourth set of the second plurality of components is attached to the fourth surface towards a fourth end of the second substrate, where the third end is opposite to the fourth end, and where each of the first substrate and the second substrate comprising a plurality of circuit traces for interconnecting at least a subset of the first plurality of the components with at least a subset of the second plurality of components, and where a second heat sink is coupled to the second substrate to thermally clamp the second substrate.

The computing system may further include a heat-shield configured to thermally separate the first end from the second end of the first substrate and thermally separate the third end from the fourth end of the second substrate such that each of the first plurality of components is configured to operate at a first temperature and each of the second plurality of components is configured to operate at a second temperature greater than the first temperature, and where the first temperature is below 9 Kelvin and where the second temperature is in a range between 80 Kelvin to 400 Kelvin.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
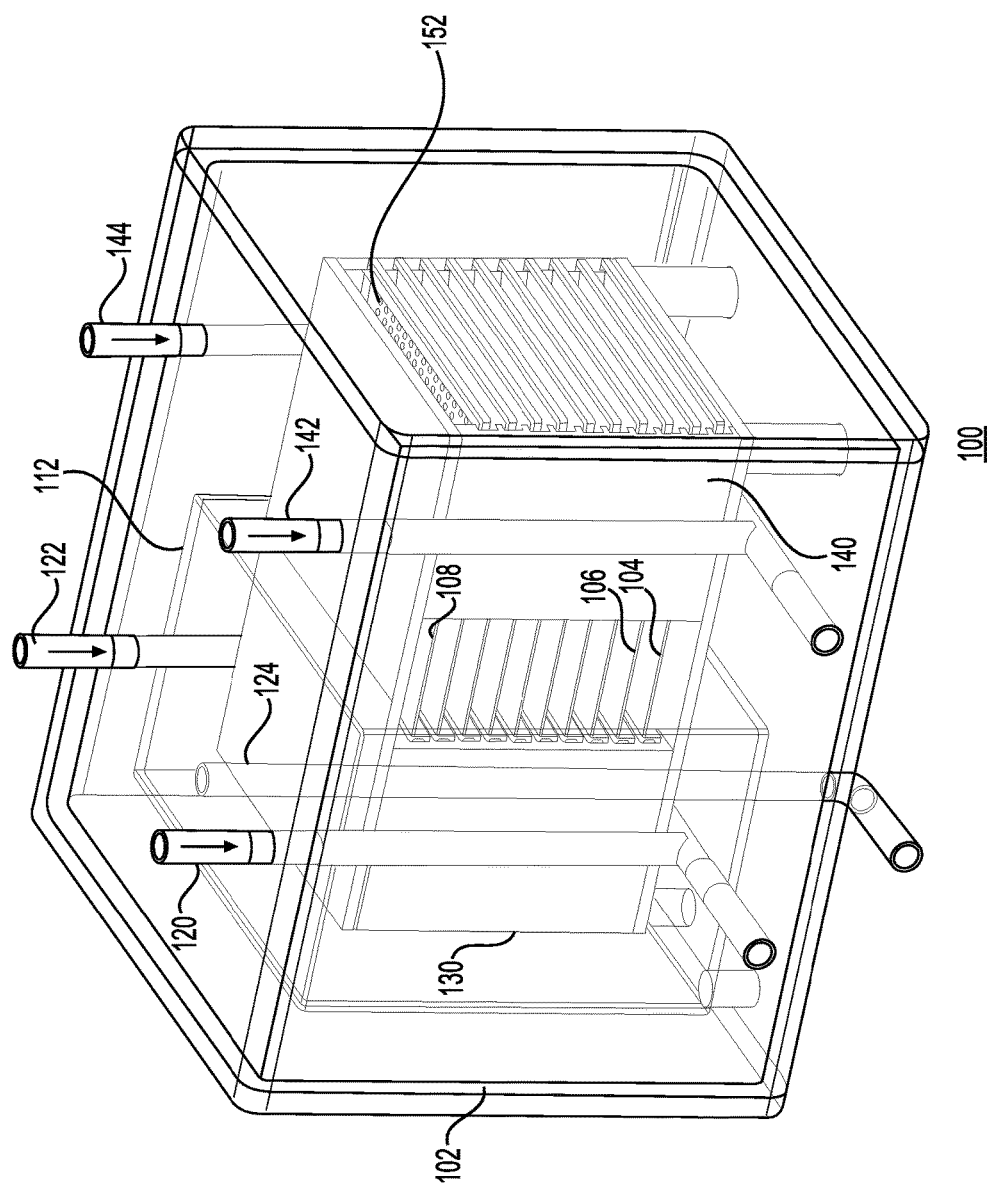
FIG. 1 shows a computing system including components located on at least one common substrate, where the at least one common substrate is inside a housing, in accordance with one example.

Examples described in this disclosure relate to computing systems that include superconducting components and devices. Certain examples of the present disclosure relate to a computing system comprising components operating at cryogenic temperatures (e.g., at or below 4 Kelvin) and components operating at non-cryogenic temperatures (e.g., at or above 300 Kelvin). In one example, the superconducting system is housed in a vacuum assembly. In this example, the superconducting system may include one or more superconducting component formed on a substrate. The superconducting component may include integrated circuit chips mounted on the substrate. Superconducting components and devices may use Josephson junctions to implement the functionality associated with a circuit. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the superconducting circuits. As an example, superconductors are materials that can carry a direct electrical current (DC) in the absence of an electric field. Superconductors have a critical temperature (Tc) below which they have zero resistance. Niobium, one such superconductor, has a critical temperature (Tc) of 9.3 Kelvin degrees. At temperatures below Tc, niobium is superconductive; however, at temperatures above Tc, it behaves as a normal metal with electrical resistance. Thus, in the SIS type of Josephson junction superconductors may be niobium superconductors and insulators may be $Al_2O_3$ barriers. In SIS type of junctions, the superconducting electrons are described by a quantum mechanical wave-function. A changing phase difference in time of the phase of the superconducting electron wave-function between the two superconductors corresponds to a potential difference between the two superconductors.

Various superconducting circuits including transmission lines can be formed by coupling multiple Josephson junctions by inductors or other components, as needed. Microwave pulses can travel via these transmission lines under the control of at least one clock. The microwave pulses can be positive or negative or a combination thereof. The microwave pulses may have a frequency of up to 10 GHz or higher. Any circuit board or other type of structure, such as an interposer with such superconducting circuits may be required to support not only the high-frequency microwave signals but also direct current (DC) signals.

Although there are several benefits of superconductivity, including lower resistance and better bandwidth characteristics, superconducting materials need to be operated at cryogenic temperatures (e.g., 4K). A typical 4K environment may require approximately 300 watts of power per watt for cooling; whereas at the non-cryogenic temperature (e.g., ambient temperature of approximately 300K), only one watt of power per watt may be required. If in a large-scale computing system that is data processing intensive hundreds of megawatts of power may be required for the 4K environment. The present disclosure describes a computing system that may advantageously consume less power by limiting thermal conduction between the 4K side and the 300K side by co-locating the components on the same substrate that is further housed inside a vacuum chamber. In addition, the use of additional features that lower the thermal conduction may further enhance the operational efficiency of such a system. As an example, thermal shields may be used to provide for radiation heat transfer.

FIG. 1 shows a computing system 100 including components located on at least one common substrate, where the at least one common substrate is inside a housing, in accordance with one example. In this example, housing 102 may be configured to maintain a vacuum inside the housing. Thus, several components (e.g., processors and memory) corresponding to computing system 100 are located inside a housing that maintains vacuum. Housing 102 may include several substrates (e.g., substrate 104, 106, and 108). Each of these substrates may be formed using glass or other suitable materials; for example, various types of polymers. In one example, the glass material may be borosilicate glass. In one example, each of these substrates may be a one-piece glass substrate. Housing 102 may further include a 77K thermal shield 112 that may be configured to thermally isolate portions of each of the substrates located inside the 77K thermal shield 112. 77K thermal shield 112 may be cooled via liquid helium flowing through each of the pipes 120 and 122 shown in FIG. 1. Pipes 120 and 122 carrying liquid helium may be brazed to 77K thermal shield 112. In one example, 77K thermal shield 112 may be formed using a nickel-iron alloy (e.g., Mu-metal). 77K thermal shield 112 may further be wrapped into a multi-layer insulation (not shown). This way 77K thermal shield 112 may effectively provide thermal isolation between the 4K space and the 300K space. In one example, superconducting components (e.g., Central-Processing Units (CPUs), Graphics-Processing Units (GPUs), Artificial Intelligence Processors, Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs)) may be located towards a first end of each of the common substrates (e.g., 104, 106, and 108). The superconducting components may be configured to provide primarily a processor functionality. As used herein the phrase "primarily a processor functionality" may include any functionality that is required to implement a processing function. As an example, without limitation, the phrase the "primary processor functionality" may include at least one of (or any appropriate combination of) a central-processing functionality, a graphics-processing functionality, an artificial-intelligence functionality, a gate-array functionality, a memory functionality, or a bus-interface-management functionality.

With continued reference to FIG. 1, the first end may be maintained at a temperature that is suitable for allowing the superconducting devices to operate consistent with the superconductivity principles. Thus, superconducting components may be maintained at cryogenic temperatures (e.g., 2K to 77K). This may be accomplished via the combination of thermal isolation and cooling via liquid helium or other such coolants. As an example, copper sidewalls 130 may be mounted adjacent to superconducting components. Copper sidewalls 130 may also be cooled via liquid helium flowing through pipes (e.g., pipe 120) as shown in FIG. 1. In one example, a system operating in a cryogenic environment may require a vacuum to operate properly. In one example, a vacuum may relate to a pressure in a range of $10^{-3}$ Torr to $10^{-10}$ Torr. The use of the vacuum ensures that there is no convection and thereby advantageously allowing components that are operating at very different temperatures to be attached to the same substrate. It is to be recognized that the temperature ranges referred to herein relate to the temperature of the environment in which these components are operating and not the temperature of the components themselves. Thus, references such as the components are "operating at" or "maintained at" refer to the temperature of the environment in which these components are operating or are being maintained inside.

Still referring to FIG. 1, in this example, non-superconducting components (e.g., CMOS, BiCMOS, or other type of devices that are suitable for operation without requiring cryogenic temperatures) may be located towards a second end of each of the common substrates (e.g., 104, 106, and 108). In this example, the non-superconducting components may comprise memory components, including any of non-volatile or volatile memory components. Volatile memory components may include any of the various types of random-access memory components, including dynamic random-access memory (DRAM) components. Non-volatile memory components may include any of various types of memory components that can store information even when they are not powered, including flash-memory components. Non-superconducting components may further include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs). Thus, while the non-superconducting components may provide primarily a storage functionality, they may include components, such as ASICs, ASSPs, SOCs, CPLDs, or other types of controllers that may coordinate communication between the superconducting components and the non-superconducting components and handle control and management of the storage devices, including DRAMs. As used herein the phrase "primarily a storage functionality" may include any functionality that is required to implement a storage function. As an example, without limitation, the phrase "primarily a storage functionality" may include at least one of (or any appropriate combination of) a memory functionality, gate-array functionality, a bus-management functionality, a controller functionality, or a bus-interface-management functionality.

Still referring to FIG. 1, the non-superconducting components may be maintained at non-cryogenic temperatures (e.g., between 200K to 400K). This may be accomplished via the combination of thermal isolation and cooling using water or some other coolant. As an example, copper sidewalls 140 may be mounted adjacent to the non-superconducting components. Copper sidewalls 140 may also be cooled via water (or some other coolant) flowing through pipes (e.g., pipe 142 and pipe 144) as shown in FIG. 1.

With continued reference to FIG. 1, superconducting components and non-superconducting components may communicate with each other using circuit traces formed on the top or the bottom surface of each of the common substrates (e.g., 104, 106, and 108). The circuit traces may be formed using a suitable manufacturing process, including, but not limited to, selective laser sintering, fused deposition modeling, direct metal laser sintering, stereolithography, cladding, electron beam melting, electron beam direct manufacturing, aerosol jetting, ink jetting, semi-solid freeform fabrication, digital light processing, 2 photon polymerization, laminated object manufacturing, 3D printing, or other similar manufacturing processes. In one example, the circuit traces may be made of niobium (or another suitable superconducting material) in a region of the substrate that includes superconducting components. This region may exclude any normal metal, e.g., copper metal. In the other region the circuit traces may be made of both niobium and copper (or another suitable metal or metal alloy comprising a superconducting metal and a normal metal)

that includes the non-superconducting components. By having the superconducting components and the non-superconducting components communicate via the signal traces located on the same substrate may advantageously lower the latency. This is because the close proximity of these components may reduce the latency. In addition, this may also lower the thermal parasitics. Although FIG. 1 shows a certain arrangement of components, substrates, and other component, these could be arranged in a different manner. In addition, fewer or additional components, substrates, and other components may be present.

Figure 2:
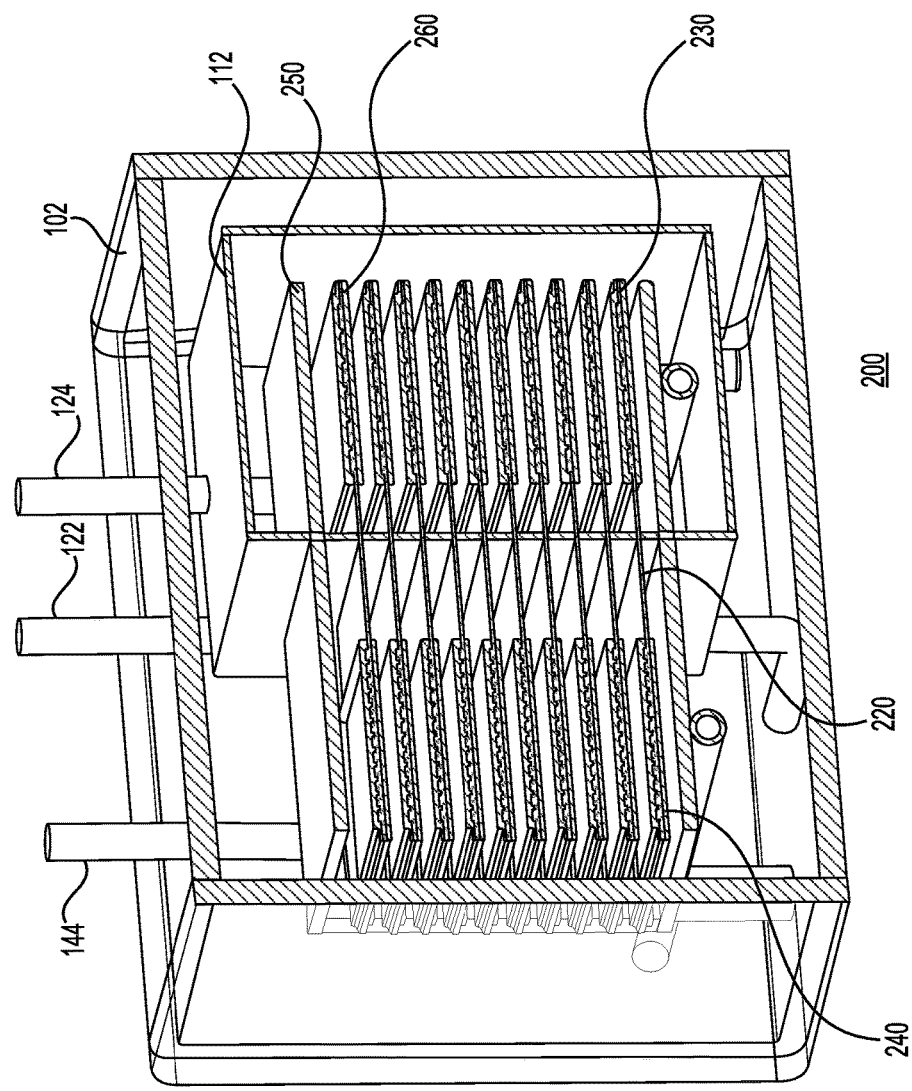
FIG. 2 shows a cross-section view of computing system in accordance with one example.

Referring now to FIG. 2, a cross-section view 200 of computing system 100 in accordance with one example. The same or similar components that are shown in FIG. 2 are referred to with the same reference numerals. In this example, superconducting components 230 and non-superconducting components 240 are shown as attached to a substrate 220. In one example, the superconducting components may be attached to each of the common substrates using any of the various techniques, including flip-chip bonding. Similarly, the non-superconducting components may be attached to each of the common substrates using any of the various techniques, including flip-chip bonding. These components may communicate with each other via signal lines formed in each of the common substrates (as described later). Heat shield 112 is used to thermally separate superconducting components 230 from non-superconducting components 240. In this example, superconducting components 230 are arranged towards the right end of substrate 220 and non-superconducting components 240 are arranged towards the left end of common substrate 220. In this way, the two types of components are thermally separated by heat shield 112. Heat shield 112 and other thermal isolation features allow superconducting components to operate at the cryogenic temperature (e.g., below 9 K) and the non-superconducting components to operate at a substantially higher temperature (e.g., in a range between 10 K to 400 K). FIG. 2 shows additional thermal isolation components, including for example copper sidewalls 250. In addition, FIG. 2 shows copper heatsinks, e.g., copper heatsink 260, which is further described later. Although FIG. 2 shows a certain number of components arranged in a certain way, computing system 100 may include fewer or additional components arranged differently.

Figure 3:
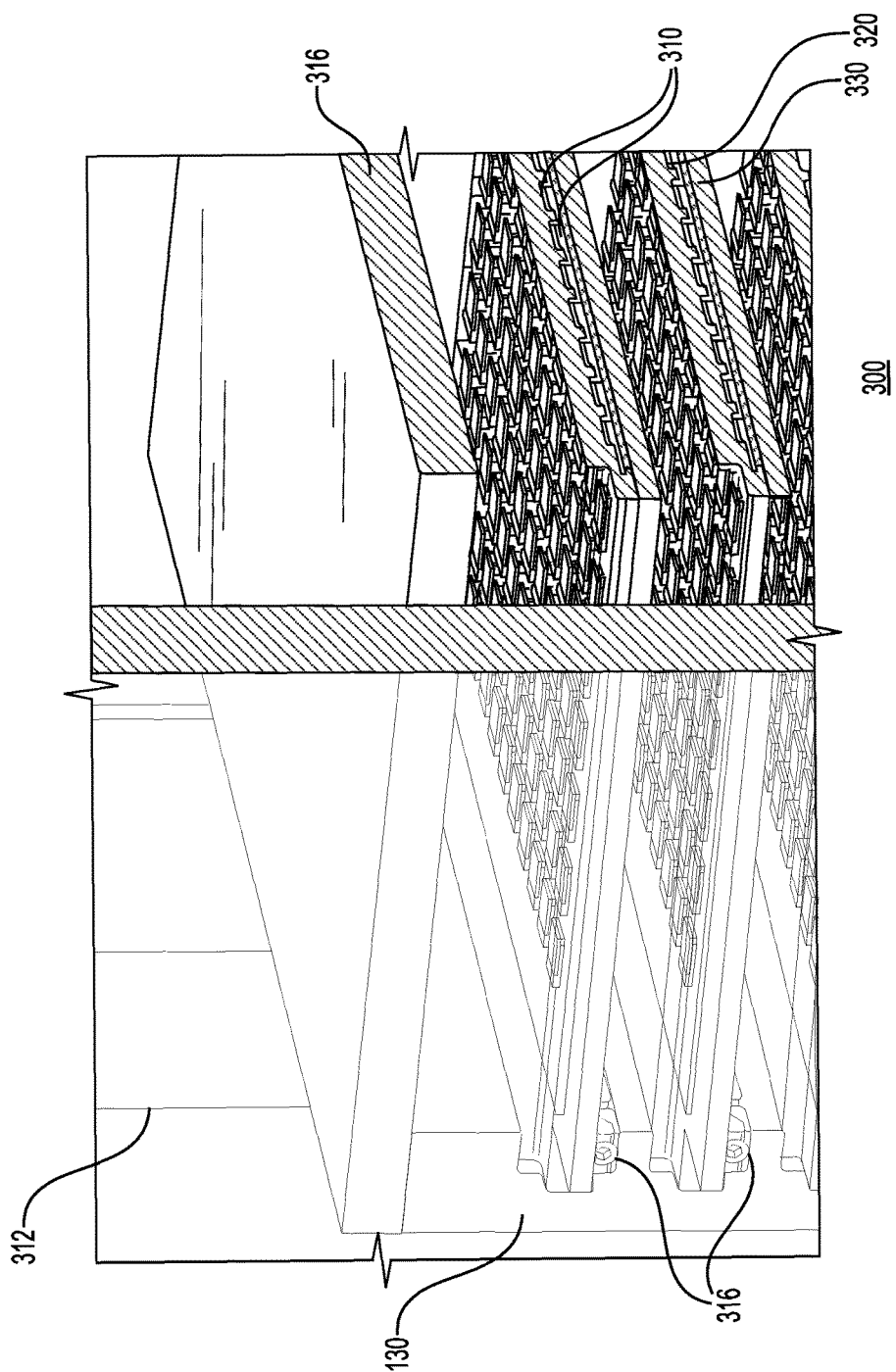
FIG. 3 shows a detailed view of a portion of the computing system of FIG. 1 in accordance with one example.

In accordance with one example, FIG. 3 shows a detailed view 300 of a portion of computing system 100 shown in the cross-section view 200. The detailed view 300 shows non-superconducting components 310 that may include components that are configured to provide primarily a storage functionality. Moreover, as described earlier, heat sink 320 and heat sink 330 may be configured to reduce heat radiation from non-superconducting components. Each of these heat sinks may be made using copper or another appropriate heat conducting metal or alloy. Wedge locks 316 may be used to ensure a tight coupling between heat sinks and the substrate including the components mounted on the substrate. FIG. 3 additionally shows pipe 312 that may be brazed to copper sidewall 130. Certain similar components shown in FIG. 3 are numbered using the same reference numerals as in FIG. 1 and FIG. 2. Although FIG. 3 shows a certain number of components arranged in a certain way, computing system 100 may include fewer or additional components arranged differently.

Figure 4:
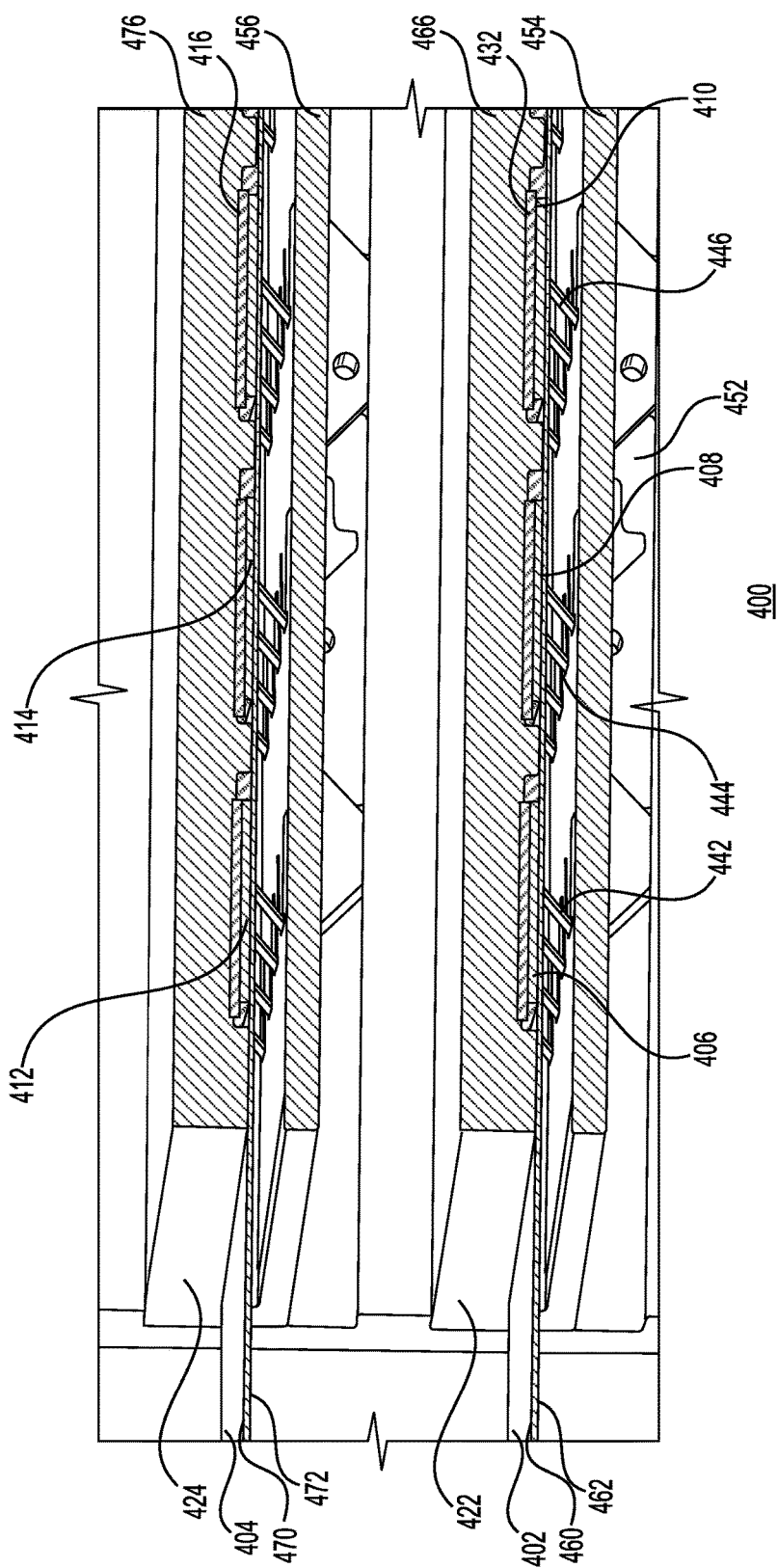
FIG. 4 shows a detailed view of a portion of the computing system of FIG. 1 in accordance with one example.

In accordance with one example, FIG. 4 shows a detailed view 400 of a portion of computing system 100 of FIG. 1. As shown in the detailed view 400, computing system 100 may include substrates 402 and 404 arranged in a housing described earlier. Substrate 402 is arranged in a plane and has a top surface 460 and a bottom surface 462. Substrate 404 is arranged in a different plane and also has a top surface 470 and a bottom surface 472. In this example, the top surface of each of the substrates is opposite to the bottom surface of each of the substrates. In this example, the superconducting components 406, 408, and 410 (or the non-superconducting components) are attached to a top surface of each of the substrates 402 and 404. In this example, the superconducting components may be attached to each of the substrates using an indium solder material. Copper heat sinks 454, 456, 466, and 476 may be configured to provide a thermal path for removing heat from the superconducting components. Mechanisms, such as spring force mechanisms 442, 444, and 446 may be used to push the superconducting components (e.g., 406, 408, and 410) into closer contact with copper heat sinks 466 and 476. In addition, wedge locks (e.g., 452) may be used to clamp the substrates (e.g., substrate 402) to copper sidewalls to provide another thermal path for cooling the substrates and the components attached to the common substrates. In this example, the components attached to substrates 402 and 404 may be coated or filled with a thermally-conductive material (e.g., indium solder) to address the coefficient of thermal expansion (CTE) mismatch between the copper heat sinks and the components (e.g., both superconducting components and non-superconducting components) that are primarily made of silicon. Although FIG. 4 shows a certain number of components arranged in a certain way, computing system 100 may include fewer or additional components arranged differently.

Figure 5:
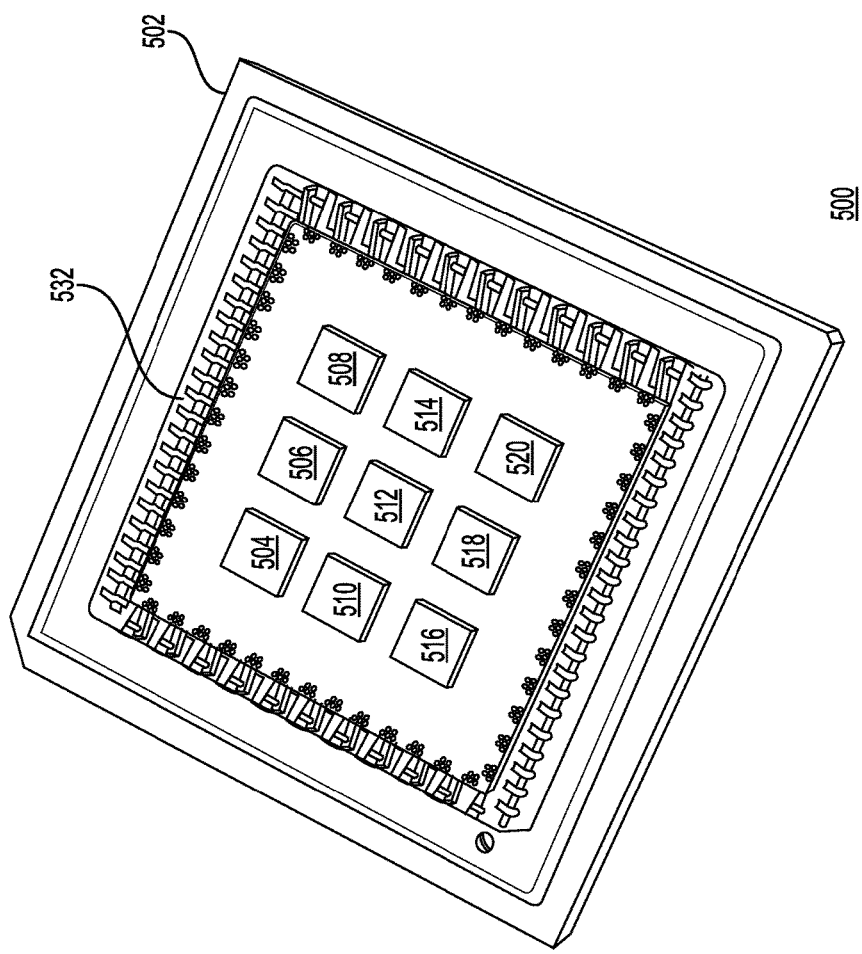
FIG. 5 shows a diagram of a component (superconducting or non-superconducting) in accordance with one example.

FIG. 5 shows a component 500 (e.g., any of the components earlier) in accordance with one example. Component 500 may include several dies located in different positions. Each of dies 504, 506, 508, 510, 512, 514, 516, 518, and 520 may be connected via signal traces to connectors at the base of component 500 (not shown). Those connectors may in turn be connected to solder balls or other attachment mechanisms for attaching each of the components to the common substrate. In one example, bump parameters may be different for each position. Signal traces or lines may connect chip bumps to the perimeter connections for evaluation and testing of the components. Although FIG. 5 shows a certain number of dies arranged in a certain way, component 500 may include fewer or additional dies arranged differently.

Figure 6:
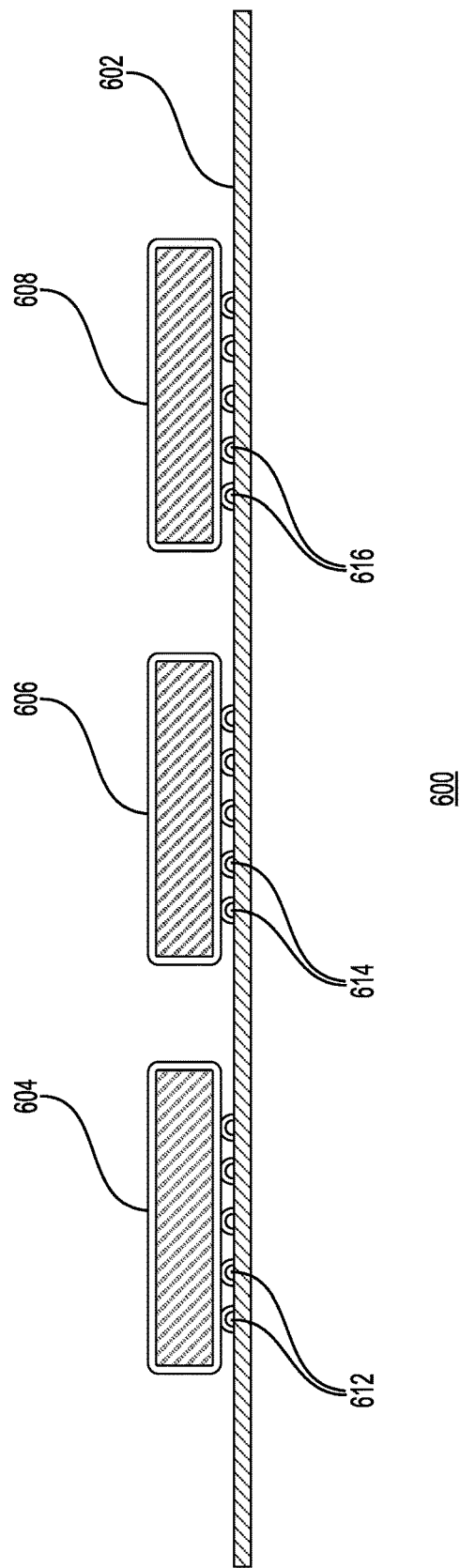
FIG. 6 shows components (e.g., superconducting components or non-superconducting components) bonded to a substrate using solder bumps in accordance with one example.

FIG. 6 shows a cross-section view of components (e.g., superconducting components or non-superconducting components) bonded to a substrate using solder bumps. In this example, component 604 may be bonded to substrate 602 using indium bumps 612. Similarly, component 606 may be bonded to substrate 602 using indium bumps 614. Finally, component 608 may be bonded to substrate 602 using indium bumps 616. Although FIG. 6 shows a certain number of components bonded using indium bumps to a substrate, other attachment techniques may also be used.

Figure 7:
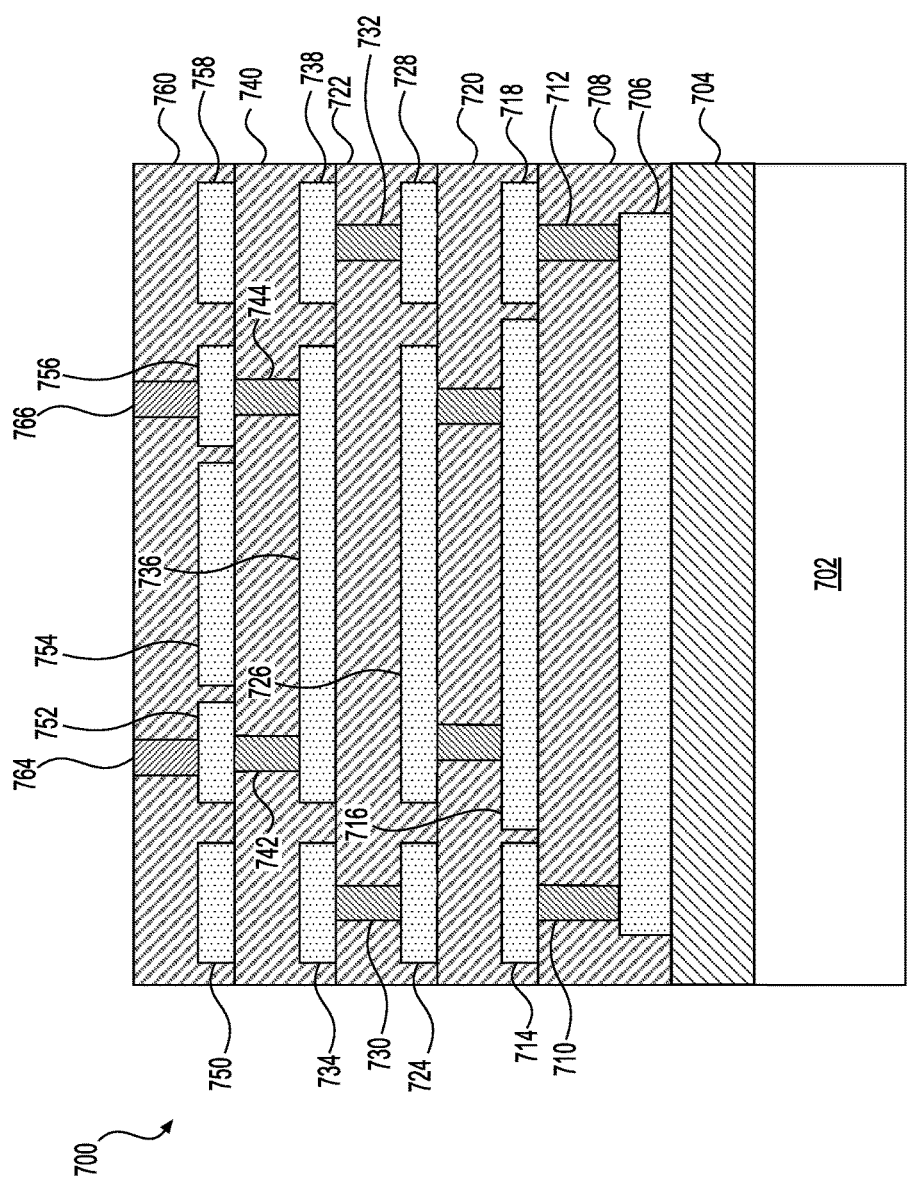
FIG. 7 shows a cross-section view of a superconducting component in accordance with one example.

FIG. 7 shows a cross-section view of a superconducting component 700 in accordance with one example. Superconducting component 700 may include a stack of superconducting layers and dielectric layers formed on a substrate. In one example, the superconducting component may be formed to support signals ranging from DC to signals having a frequency that is greater than 10 GHz. In this example, the superconducting component may be fabricated over large silicon substrates such as 200 mm wafers, 300 mm wafers or even larger wafers, which may be separated into multiple dies. In one example, the substrate could be made from silicon or any other thermally insulating or conducting material. Also, in this example, signal traces and ground planes may be formed by sputtering niobium, or a similar superconducting material. As an example, compounds of niobium such as niobium nitride (NbN) or niobium titanium nitride (NbTiN) may also be used. Other physical vapor deposition (PVD) methods, such as molecular beam epitaxy (MBE) may also be used. Depending on the type of the material used for the traces, sputtering processes, chemical vapor deposition (CVD) processes, plasma enhanced chemical vapor deposition (PECVD) process, evaporation processes, or atomic layer deposition (ALD) processes may also be used. Thus, for example, the niobium compounds such as NbN and NbTiN may be formed using a CVD process.

With continued reference to FIG. 7, in the example superconducting component 700, the dielectric layers could be spin-on polyimide, Benzocyclobutene (BCB), liquid crystal polymer (LCP), or some other polymer material. The superconducting component 700 may further include vias that may be formed by conformal deposition of the niobium in the same deposition step as the traces or ground plane. The via wells could be patterned directly in a photo-imageable polyimide, or etched in a separate step. The metal traces and vias may be defined in the same subtractive etch step. The pad connections may be configured to support Ti/Au or Ti/Al pads for a variety of wire bond or flip chip bump and wire bond technologies, such as Indium solder bump, Tin-Silver (Snag) solder bump, Gold stud bump, Copper pillar bump, or other electrical interconnect bump types.

Still referring to FIG. 7, superconducting component may include a dielectric layer 704 formed over a substrate 702. Substrate 702 may be a silicon substrate, a sapphire substrate, a glass substrate, or any other suitable substrate. Dielectric layer 704 may be formed by depositing a dielectric (e.g., liquid crystal polymer (LCP)) on substrate 702. A superconducting layer 706 may be formed over dielectric layer 704. Superconducting layer 706 may be formed using any of the deposition techniques, such as CVD or PECVD, and then patterning the deposited material using photolithography. In this example, superconducting layer 706 may be formed by depositing niobium over dielectric layer 704. A photo-lithography process may be used to pattern superconducting layer 706 to create superconducting wires or other superconducting structures. Next, using processes, such as chemical-mechanical polishing, the excess portions of the superconducting layer 706 may be removed. In one example, the superconducting wires may be formed using niobium or other suitable metals. The layout for the superconducting structures may be created using a place and route design tool that is used to create the layout for the superconducting wires or other elements. As an example, photoresist may be patterned to protect only those areas of superconducting layer 706 that will be formed as superconducting wires or other structures as defined by the layout of the particular layer, such as a metal layer. Other superconducting metals or metal alloys may also be used as part of this step. In one example, the vias and the traces may be formed by conformal deposition of niobium in the same deposition step as the one used for forming the traces. Niobium may be deposited by sputtering or other similar processes. Other physical vapor deposition (PVD) methods, such as molecular beam epitaxy (MBE) may also be used. Superconducting component 700 may further include a dielectric layer 708 formed over a superconducting layer 706. Dielectric layer 708 may be formed by depositing a dielectric (e.g., liquid polymer) on superconducting layer 706. In one example, dielectric layer 708 may be formed by spinning on polyimide on superconducting layer 706. Another superconducting layer may be formed over dielectric layer 708. Vias 710 and 712 may be formed by creating via or contact holes in dielectric layer 708 and filling them with niobium or a similar superconducting material. Additional superconducting traces including 714, 716, and 718 may be formed as part of the next superconducting layer included in the superconducting component. Next, a dielectric layer 720 is shown as formed over the superconducting traces or planes (for example the superconducting layer including superconducting traces 714, 716, and 718). Dielectric layer 720 may be formed by depositing a dielectric (e.g., a liquid polymer) on the superconducting layer. In one example, dielectric layer 720 may be formed by spinning on polyimide on the superconducting layer. Next, another superconducting layer may be formed over dielectric layer 720. Vias may be formed by creating via or contact holes in dielectric layer 720 and filling them with niobium or a similar superconducting material. Additional superconducting traces including 724, 726, and 728 may be formed as part of the next superconducting layer included in the superconducting component. In one example, the superconducting wires may be formed using niobium or other suitable metals. Yet another dielectric layer 722 is shown as formed over superconducting traces or planes (for example the superconducting layer including superconducting traces 724, 726, and 728). Dielectric layer 722 may be formed by depositing a dielectric (e.g., a liquid polymer) on the superconducting layer. In one example, dielectric layer 722 may be formed by spinning on polyimide on the superconducting layer. Next, vias 730 and 732 and superconducting traces 734, 736, and 738 are shown as formed. In one example, the superconducting wires may be formed using niobium or other suitable metals. Next, another dielectric layer 740 may be formed. This layer may be formed using similar processes as described earlier. Next, vias 742 and 744 and superconducting traces 750, 752, 754, 756, and 758 are shown as formed. In one example, the superconducting wires may be formed using niobium or other suitable metals. Finally, vias 764 and 766 are shown as formed to provide for pad connections. The pad connections may be configured to support titanium/gold (Ti/Au) or titanium/aluminum (Ti/Al) pads for a variety of bump and wire bond technologies, such as Indium bump, C4 bump, or Copper pillar. Although FIG. 7 shows a certain number of layers of the superconducting component 700 arranged in a certain manner, there could be more or fewer numbers of layers arranged differently. In addition, although certain steps are described as being performed in a certain order, additional or fewer steps, in a different order may be performed to fabricate superconducting component 700.

With continued reference to FIG. 7, in one example, superconducting layer 106 may be configured to distribute clock signals through the superconducting component. The next set of superconducting traces (e.g., superconducting traces 714, 716, and 718) may be configured to distribute clock signals through the superconducting component. The next set of superconducting traces (e.g., superconducting traces 724, 726, and 728) may be configured to act as the ground plane for the superconducting component. The next set of superconducting traces (e.g., superconducting traces 734, 736, and 738) may be configured to distribute signals other than the clock signals through the superconducting component. The next set of superconducting traces (e.g., superconducting traces 750, 752, 754, 756, and 758) may be configured to distribute signals other than the clock signals through the superconducting component. Indeed, the functionality of the various superconducting layers could be modified based on the requirements associated with the superconducting component.

Figure 8:
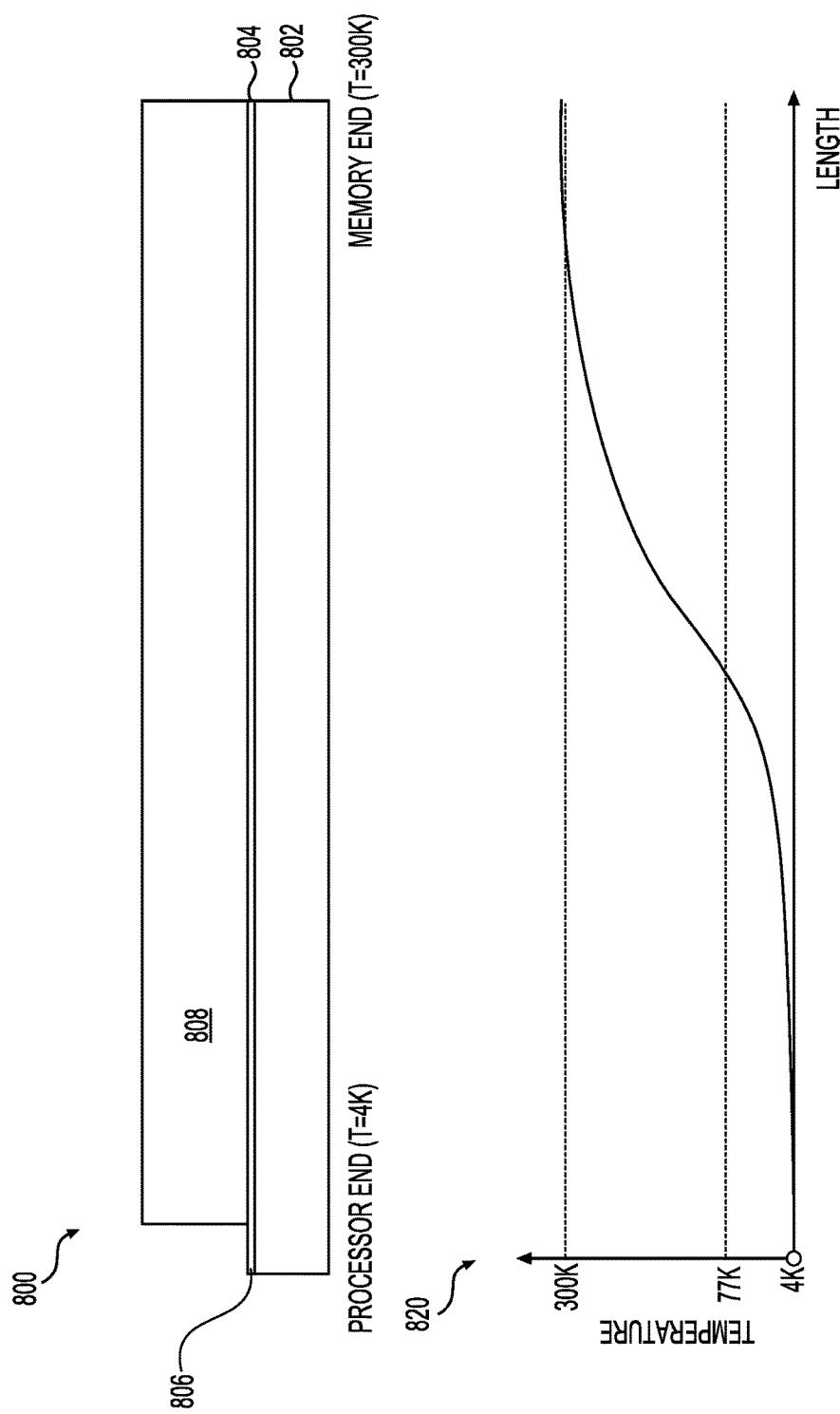
FIG. 8 shows a substrate with a graph showing the variation in the temperature along the length of the substrate in accordance with one example.

FIG. 8 shows a substrate 800 with a graph 820 showing the variation in the temperature along the length of substrate 800 in accordance with one example. Substrate 800 includes a substrate layer 802, the non-superconducting component layer 804, the superconducting component layer 806, and a heat sink 808. In this example, a thick (hence highly thermally conductive) copper heat sink 808 is used to effectuate the maintenance of a low temperature along a substantial length of the substrate 800. The component layers may include the chips attached to the substrate layer 802 via various mechanisms. The copper heat sink 808 is configured such that the superconducting components can be formed as part of the superconducting component layer 806 and the heat sink 808 does not cover them. Graph 820 shows the variation in the temperature of the environment in which the substrate 800 is deployed. Thus, the temperature on the processor end is approximately 4K and the temperature on the memory end is approximately 300K. Despite this variation in temperature along the length of substrate 800, the various techniques and methodologies described earlier ensure proper operation of both the superconducting components and the non-superconducting components.

In conclusion, in one aspect of the present disclosure, a computing system including a housing, where a lower pressure is maintained inside the housing than an atmospheric pressure outside the housing is provided. In one example, the lower pressure may be in a range between $10^{-3}$ Torr to $10^{-10}$ Torr.

The computing system may further include a first substrate, inside the housing, arranged in a first plane having a first surface and a second surface parallel to the first plane, where the second surface is opposite to the first surface, where a first set of the first plurality of components is attached to the second surface towards a first end of the first substrate and where a second set of the second plurality of components is attached to the second surface towards a second end of the first substrate, where the first end is opposite to the second end, where each of the first plurality of components is configured to provide primarily a processor functionality and where each of the second plurality of components is configured to provide primarily a storage functionality.

The computing system may further include a second substrate, inside the housing, arranged in a second plane above or below the first plane, the second substrate having a third surface and a fourth surface parallel to the second plane, where the fourth surface is opposite to the third surface, where a third set of the first plurality of components is attached to the fourth surface towards a third end of the second substrate and where a fourth set of the second plurality of components is attached to the fourth surface towards a fourth end of the second substrate, where the third end is opposite to the fourth end, and where each of the first substrate and the second substrate comprising a plurality of circuit traces for interconnecting at least a subset of the first plurality of the components with at least a subset of the second plurality of components. Each of the plurality of circuit traces may include a first region including a superconducting metal but excluding a normal metal and a second region including both the superconducting metal and the normal metal.

The computing system may further include a heat-shield configured to thermally separate the first end from the second end of the first substrate and thermally separate the third end from the fourth end of the second substrate such that each of the first plurality of components is configured to operate at a first temperature and each of the second plurality of components is configured to operate at a second temperature greater than the first temperature, and where the first temperature is in a range between 2 Kelvin to 77 Kelvin and wherein the second temperature is in a range between 200 Kelvin to 400 Kelvin.

The primary processor functionality may include at least one of a central-processing functionality, a graphics-processing functionality, an artificial-intelligence functionality, a gate-array functionality, a memory functionality, or a bus-interface-management functionality. The primary storage functionality may include at least one of a memory functionality, gate-array functionality, a bus-management functionality, a controller functionality, or a bus-interface-management functionality.

Each of the first plurality of components may be selected from a group comprising a central processing unit, a graphics-processing unit, an artificial-intelligence processor, a field-programmable gate array, an application-specific integrated circuit, an application-specific standard product, a system-on-a-chip, a complex programmable logic device, a random-access memory, and a Josephson magnetic random-access memory. Each of the second plurality of components may be selected from a group comprising a dynamic random-access memory, a field-programmable gate array, an application-specific integrated circuit, an application-specific standard product, a system-on-a-chip, and a complex programmable logic device.

In another aspect of the present disclosure, a computing system comprising housing, where a vacuum is maintained inside the housing is provided. In one example, the vacuum may correspond to a pressure in a range between $10^{-3}$ Torr to $10^{-10}$ Torr.

The computing system may further include a first substrate, inside the housing, arranged in a first plane having a first surface and a second surface parallel to the first plane, where the second surface is opposite to the first surface, where a first set of the first plurality of components is attached to the second surface towards a first end of the first substrate and where a second set of the second plurality of components is attached to the second surface towards a second end of the first substrate, where the first end is opposite to the second end, where each of the first plurality of components is configured to provide primarily a processor functionality and where each of the second plurality of components is configured to provide primarily a storage functionality.

The computing system may further include a second substrate, inside the housing, arranged in a second plane above or below the first plane, the second substrate having a third surface and a fourth surface parallel to the second plane, where the fourth surface is opposite to the third surface, where a third set of the first plurality of components is attached to the fourth surface towards a third end of the second substrate and where a fourth set of the second plurality of components is attached to the fourth surface towards a fourth end of the second substrate, where the third end is opposite to the fourth end, and where each of the first substrate and the second substrate comprising a plurality of circuit traces for interconnecting at least a subset of the first plurality of the components with at least a subset of the second plurality of components. Each of the plurality of circuit traces may include a first region including a superconducting metal but excluding a normal metal and a second region including both the superconducting metal and the normal metal.

The computing system may further include a heat-shield configured to thermally separate the first end from the second end of the first substrate and thermally separate the third end from the fourth end of the second substrate such that each of the first plurality of components is configured to operate at a first temperature and each of the second plurality of components is configured to operate at a second temperature greater than the first temperature, and where the first temperature is in a range between 2 Kelvin to 77 Kelvin and where the second temperature is in a range between 200 Kelvin to 400 Kelvin.

The primary processor functionality may include at least one of a central-processing functionality, a graphics-processing functionality, an artificial-intelligence functionality, a gate-array functionality, a memory functionality, or a bus-interface-management functionality. The primary storage functionality may include at least one of a memory functionality, gate-array functionality, a bus-management functionality, a controller functionality, or a bus-interface-management functionality.

Each of the first plurality of components may be selected from a group comprising a central processing unit, a graphics-processing unit, an artificial-intelligence processor, a field-programmable gate array, an application-specific integrated circuit, an application-specific standard product, a system-on-a-chip, a complex programmable logic device, a random-access memory, and a Josephson magnetic random-access memory. Each of the second plurality of components may be selected from a group comprising a dynamic random-access memory, a field-programmable gate array, an application-specific integrated circuit, an application-specific standard product, a system-on-a-chip, and a complex programmable logic device.

In yet another aspect, the present disclosure relates to a computing system including a housing, where a vacuum is maintained inside the housing. In one example, the vacuum may correspond to a pressure in a range between $10^{-3}$ Torr to $10^{-10}$ Torr.

The computing system may further include a first substrate, inside the housing, arranged in a first plane having a first surface and a second surface parallel to the first plane, where the second surface is opposite to the first surface, where a first set of the first plurality of components is attached to the second surface towards a first end of the first substrate and where a second set of the second plurality of components is attached to the second surface towards a second end of the first substrate, where the first end is opposite to the second end, where each of the first plurality of components is configured to provide primarily a processor functionality and where each of the second plurality of components is configured to provide primarily a storage functionality, and where a first heat sink is coupled to the first substrate to thermally clamp the first substrate.

The computing system may further include a second substrate, inside the housing, arranged in a second plane above or below the first plane, the second substrate having a third surface and a fourth surface parallel to the second plane, where the fourth surface is opposite to the third surface, where a third set of the first plurality of components is attached to the fourth surface towards a third end of the second substrate and where a fourth set of the second plurality of components is attached to the fourth surface towards a fourth end of the second substrate, where the third end is opposite to the fourth end, and where each of the first substrate and the second substrate comprising a plurality of circuit traces for interconnecting at least a subset of the first plurality of the components with at least a subset of the second plurality of components, and where a second heat sink is coupled to the second substrate to thermally clamp the second substrate.

The computing system may further include a heat-shield configured to thermally separate the first end from the second end of the first substrate and thermally separate the third end from the fourth end of the second substrate such that each of the first plurality of components is configured to operate at a first temperature and each of the second plurality of components is configured to operate at a second temperature greater than the first temperature, and where the first temperature is below 9 Kelvin and where the second temperature is in a range between 80 Kelvin to 400 Kelvin.

The primary processor functionality may include at least one of a central-processing functionality, a graphics-processing functionality, an artificial-intelligence functionality, a gate-array functionality, a memory functionality, or a bus-interface-management functionality. The primary storage functionality may include at least one of a memory functionality, gate-array functionality, a bus-management functionality, a controller functionality, or a bus-interface-management functionality.

Each of the first plurality of components may be selected from a group comprising a central processing unit, a graphics-processing unit, an artificial-intelligence processor, a field-programmable gate array, an application-specific integrated circuit, an application-specific standard product, a system-on-a-chip, a complex programmable logic device, a random-access memory, and a Josephson magnetic random-access memory. Each of the second plurality of components may be selected from a group comprising a dynamic random-access memory, a field-programmable gate array, an application-specific integrated circuit, an application-specific standard product, a system-on-a-chip, and a complex programmable logic device.

It is to be understood that the methods, modules, and components depicted herein are merely exemplary. For example, and without limitation, illustrative types of superconducting devices may include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc.

In addition, in an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above-described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A computing system comprising: a housing, wherein a lower pressure is maintained inside the housing than an atmospheric pressure outside the housing; a first plurality of components; a second plurality of components; a first substrate, inside the housing, arranged in a first plane having a first surface and a second surface parallel to the first plane, wherein the second surface is opposite to the first surface, wherein a first set of the first plurality of components is attached to the second surface towards a first end of the first substrate and wherein a second set of the second plurality of components is attached to the second surface towards a second end of the first substrate, wherein the first end is opposite to the second end, wherein each of the first plurality of components is configured to provide primarily a processor functionality and wherein each of the second plurality of components is configured to provide primarily a storage functionality; a second substrate, inside the housing, arranged in a second plane above or below the first plane, the second substrate having a third surface and a fourth surface parallel to the second plane, wherein the fourth surface is opposite to the third surface, wherein a third set of the first plurality of components is attached to the fourth surface towards a third end of the second substrate and wherein a fourth set of the second plurality of components is attached to the fourth surface towards a fourth end of the second substrate, wherein the third end is opposite to the fourth end, and wherein each of the first substrate and the second substrate comprising a plurality of circuit traces for interconnecting at least a subset of the first plurality of the components with at least a subset of the second plurality of components; and a heat-shield configured to thermally separate the first end from the second end of the first substrate and thermally separate the third end from the fourth end of the second substrate such that each of the first plurality of components is configured to operate at a first temperature and each of the second plurality of components is configured to operate at a second temperature greater than the first temperature, and wherein the first temperature is in a range between 2 Kelvin to 77 Kelvin and wherein the second temperature is in a range between 200 Kelvin to 400 Kelvin.

2. The computing system of claim 1, wherein the lower pressure is in a range between $10^{-3}$ Torr to $10^{-10}$ Torr.

3. The computing system of claim 1, wherein the primary processor functionality comprises at least one of a central-processing functionality, a graphics-processing functionality, an artificial-intelligence functionality, a gate-array functionality, a memory functionality, or a bus-interface-management functionality.

4. The computing system of claim 1, wherein the primary storage functionality comprises at least one of a memory functionality, gate-array functionality, a bus-management functionality, a controller functionality, or a bus-interface-management functionality.

5. The computing system of claim 1, wherein each of the first plurality of components is selected from a group comprising a central processing unit, a graphics-processing unit, an artificial-intelligence processor, a field-programmable gate array, an application-specific integrated circuit, an application-specific standard product, a system-on-a-chip, a complex programmable logic device, a random-access memory, and a Josephson magnetic random-access memory.

6. The computing system of claim 1, wherein each of the second plurality of components is selected from a group comprising a dynamic random-access memory, a field-programmable gate array, an application-specific integrated circuit, an application-specific standard product, a system-on-a-chip, and a complex programmable logic device.

7. The computing system of claim 1, wherein in each of the plurality of circuits traces comprises a first region including a superconducting metal but excluding a normal metal and a second region including both the superconducting metal and the normal metal.

8. A computing system comprising: a housing, wherein a vacuum is maintained inside the housing; a first plurality of components; a second plurality of components; a first substrate, inside the housing, arranged in a first plane having a first surface and a second surface parallel to the first plane, wherein the second surface is opposite to the first surface, wherein a first set of the first plurality of components is attached to the second surface towards a first end of the first substrate and wherein a second set of the second plurality of components is attached to the second surface towards a second end of the first substrate, wherein the first end is opposite to the second end, wherein each of the first plurality of components is configured to provide primarily a processor functionality and wherein each of the second plurality of components is configured to provide primarily a storage functionality; a second substrate, inside the housing, arranged in a second plane above or below the first plane, the second substrate having a third surface and a fourth surface parallel to the second plane, wherein the fourth surface is opposite to the third surface, wherein a third set of the first plurality of components is attached to the fourth surface towards a third end of the second substrate and wherein a fourth set of the second plurality of components is attached to the fourth surface towards a fourth end of the second substrate, wherein the third end is opposite to the fourth end, and wherein each of the first substrate and the second substrate comprising a plurality of circuit traces for interconnecting at least a subset of the first plurality of the components with at least a subset of the second plurality of components; and a heat-shield configured to thermally separate the first end from the second end of the first substrate and thermally separate the third end from the fourth end of the second substrate such that each of the first plurality of components is configured to operate at a first temperature and each of the second plurality of components is configured to operate at a second temperature greater than the first temperature, and wherein the first temperature is in a range between 2 Kelvin to 77 Kelvin and wherein the second temperature is in a range between 200 Kelvin to 400 Kelvin.

9. The computing system of claim 8, wherein the vacuum corresponds to a pressure in a range between $10^{-3}$ Torr to $10^{-10}$ Torr.

10. The computing system of claim 8, wherein the primary processor functionality comprises at least one of a central-processing functionality, a graphics-processing functionality, an artificial-intelligence functionality, a gate-array functionality, a memory functionality, or a bus-interface-management functionality.

11. The computing system of claim 8, wherein the primary storage functionality comprises at least one of a memory functionality, gate-array functionality, a bus-management functionality, a controller functionality, or a bus-interface-management functionality.

12. The computing system of claim 8, wherein each of the first plurality of components is selected from a group comprising a central processing unit, a graphics-processing unit, an artificial-intelligence processor, a field-programmable gate array, an application-specific integrated circuit, an application-specific standard product, a system-on-a-chip, a complex programmable logic device, a random-access memory, and a Josephson magnetic random-access memory.

13. The computing system of claim 8, wherein each of the second plurality of components is selected from a group comprising a dynamic random-access memory, a field-programmable gate array, an application-specific integrated circuit, an application-specific standard product, a system-on-a-chip, and a complex programmable logic device.

14. The computing system of claim 8, wherein in each of the plurality of circuits traces comprises a first region including a superconducting metal but excluding a normal metal and a second region including both the superconducting metal and the normal metal.

15. A computing system comprising: a housing, wherein a vacuum is maintained inside the housing; a first plurality of components; a second plurality of components; a first substrate, inside the housing, arranged in a first plane having a first surface and a second surface parallel to the first plane, wherein the second surface is opposite to the first surface, wherein a first set of the first plurality of components is attached to the second surface towards a first end of the first substrate and wherein a second set of the second plurality of components is attached to the second surface towards a second end of the first substrate, wherein the first end is opposite to the second end, wherein each of the first plurality of components is configured to provide primarily a processor functionality and wherein each of the second plurality of components is configured to provide primarily a storage functionality, and wherein a first heat sink is coupled to the first substrate to thermally clamp the first substrate; a second substrate, inside the housing, arranged in a second plane above or below the first plane, the second substrate having a third surface and a fourth surface parallel to the second plane, wherein the fourth surface is opposite to the third surface, wherein a third set of the first plurality of components is attached to the fourth surface towards a third end of the second substrate and wherein a fourth set of the second plurality of components is attached to the fourth surface towards a fourth end of the second substrate, wherein the third end is opposite to the fourth end, and wherein each of the first substrate and the second substrate comprising a plurality of circuit traces for interconnecting at least a subset of the first plurality of the components with at least a subset of the second plurality of components, and wherein a second heat sink is coupled to the second substrate to thermally clamp the second substrate; and a heat-shield configured to thermally separate the first end from the second end of the first substrate and thermally separate the third end from the fourth end of the second substrate such that each of the first plurality of components is configured to operate at a first temperature and each of the second plurality of components is configured to operate at a second temperature greater than the first temperature, and wherein the first temperature is below 9 Kelvin and wherein the second temperature is in a range between 80 Kelvin to 400 Kelvin.

16. The computing system of claim 15, wherein the vacuum corresponds to a pressure in a range between $10^{-3}$ Torr to $10^{-10}$ Torr.

17. The computing system of claim 15, wherein the primary processor functionality comprises at least one of a central-processing functionality, a graphics-processing functionality, an artificial-intelligence functionality, a gate-array functionality, a memory functionality, or a bus-interface-management functionality.

18. The computing system of claim 15, wherein the primary storage functionality comprises at least one of a memory functionality, gate-array functionality, a bus-management functionality, a controller functionality, or a bus-interface-management functionality.

19. The computing system of claim 15, wherein each of the first plurality of components is selected from a group comprising a central processing unit, a graphics-processing unit, an artificial-intelligence processor, a field-programmable gate array, an application-specific integrated circuit, an application-specific standard product, a system-on-a-chip, a complex programmable logic device, a random-access memory, and a Josephson magnetic random-access memory.

20. The computing system of claim 15, wherein each of the second plurality of components is selected from a group comprising a dynamic random-access memory, a field-programmable gate array, an application-specific integrated circuit, an application-specific standard product, a system-on-a-chip, and a complex programmable logic device.

* * * * *